(12) United States Patent
Chidambarrao et al.

(10) Patent No.: US 7,818,692 B2
(45) Date of Patent: Oct. 19, 2010

(54) AUTOMATED OPTIMIZATION OF DEVICE STRUCTURE DURING CIRCUIT DESIGN STAGE

(75) Inventors: Dureseti Chidambarrao, Weston, CT (US); Jason Hibbeler, Williston, VT (US); Richard Q. Williams, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 447 days.

(21) Appl. No.: 11/946,937

(22) Filed: Nov. 29, 2007

(65) Prior Publication Data
US 2009/0144670 A1   Jun. 4, 2009

(51) Int. Cl.
G06F 17/50 (2006.01)
G06F 9/45 (2006.01)

(52) U.S. Cl. ............................. 716/2; 716/6; 716/10
(58) Field of Classification Search .................. 716/2, 716/6, 10
See application file for complete search history.

(56) References Cited

U.S. PATENT DOCUMENTS

| | | | |
|---|---|---|---|
| 6,202,193 B1 * | 3/2001 | Emura et al. | 716/10 |
| 7,009,226 B1 * | 3/2006 | Sun | 257/192 |
| 2007/0028195 A1 | 2/2007 | Chidambarrao et al. | |
| 2007/0283301 A1 * | 12/2007 | Karandikar et al. | 716/5 |
| 2008/0148203 A1 * | 6/2008 | Alpert et al. | 716/6 |

FOREIGN PATENT DOCUMENTS

CN    1638096 A    4/2010

OTHER PUBLICATIONS

U.S. Appl. No. 11/278,162, filed Mar. 31, 2006 to Christopher J. Gonzalez, entitled: "Method of Implementing Overlay-Based Modification of VLSI Design Layout".

* cited by examiner

*Primary Examiner*—Jack Chiang
*Assistant Examiner*—Magid Y Dimyan
(74) *Attorney, Agent, or Firm*—Daryl K. Neff; H. Daniel Schnurmann

(57) ABSTRACT

A method of improving a circuit design for a very large scale integrated circuit is provided which represents a plurality of semiconductor devices interconnected in a circuit. It is determined whether an edge of a feature of one of the plurality of semiconductor devices in the design can be moved in a first direction by a distance within a permitted range, such that a performance goal and a matching goal for the circuit are served. If so, the edge is moved in the first direction by the distance calculated to best serve the performance goal and the matching goal. The foregoing steps may be repeated for each of the plurality of semiconductor devices. If necessary, the foregoing steps may be repeated until the performance goal and matching goal for the circuit are deemed to be adequately served.

10 Claims, 5 Drawing Sheets

AUTOMATED OPTIMIZATION OF DEVICE STRUCTURE DURING CIRCUIT DESIGN STAGE

BACKGROUND OF THE INVENTION

The present invention relates to the design and fabrication of microelectronic elements, e.g., integrated circuits including microelectronic devices.

Various approaches have been used to optimize the performance of transistors of a layout during the circuit design phase of design. For example in commonly assigned co-pending U.S. application Ser. No. 11/278,162 to Christopher J. Gonzalez et al. entitled "Method for Implementing Overlay-Based Modification of VLSI Design Layout", the performance of individual transistors can be maximized by moving the boundaries of n-wells (doped semiconductor regions) of the transistors outwards as far from the channels of the transistors as allowed by design rules. This approach would be advantageous when most devices in the layout are weaker than the reference device of the compact model, the compact model representing the device layout with a reference performance level. Then, it is possible to apply a process which only improves the performance of all the devices, since moving the boundaries in one direction only is straightforward, and the boundaries can be moved to positions where the device can readily conform to the reference device of the compact model. However, sometimes it is intended per design intent that some devices of a layout are required to be either weaker or stronger than the reference device of the compact model. Then, while it is desirable to change the performance of that device (while preserving the performance of the surrounding devices in the circuit design) the specific direction of moving the edge has to be modified through a set of instructions relative to design intent.

In another example, as described in commonly owned United States Patent Publication No. 2007/0028195 to Dureseti Chidambarrao et al. entitled "Methodology For Layout-Based Modulation And Optimization Of Nitride Liner Stress Effect In Compact Models," the effect of a change in a stressed liner of a transistor on the performance of that transistor can be modeled.

SUMMARY OF THE INVENTION

In accordance with an aspect of the invention, a method is provided for improving a design for a very large scale integrated circuit having a plurality of semiconductor devices interconnected in a circuit. In such method, an edge of a feature of one of the plurality of semiconductor devices in the design can be moved in a first direction relative to a fixed reference when doing so would improve performance of the circuit. Such step of moving the edge can be repeated for each of the plurality of semiconductor devices.

For example, in accordance with one aspect of the invention, a method is provided for improving a design for a very large scale integrated circuit which represents a plurality of semiconductor devices interconnected in a circuit. It is determined whether an edge of a feature of one of the plurality of semiconductor devices in the design can be moved in a first direction by a distance within a permitted range, such that a performance goal and a matching goal for the circuit are served. If so, the edge is moved in the first direction by the distance calculated to best serve the performance goal and the matching goal. The foregoing steps may be repeated for each of the plurality of semiconductor devices. If necessary, the foregoing steps may be repeated until the performance goal and matching goal for the circuit are deemed to be adequately served.

In accordance with another aspect of the invention, a recording medium is provided which has computer-readable instructions recorded thereon. The instructions are executable by a computer to perform the method of improving the design of the integrated circuit as described in the foregoing.

In accordance with another aspect of the invention, an information processing system is provided which is operable to improve a design for an integrated circuit. Such information processing system includes a processor and instructions which are executable to perform a method as described in the foregoing.

DETAILED DESCRIPTION

Figure 1:
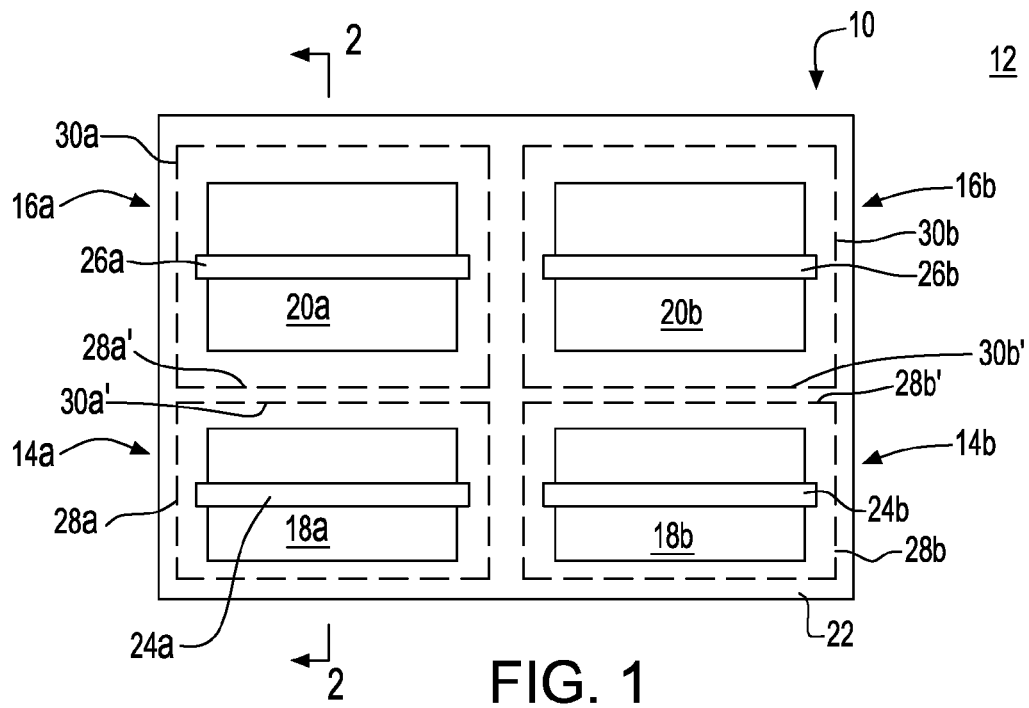
FIG. 1 is a plan view illustrating a layout for a circuit design of a portion of a microelectronic element, e.g., a semiconductor chip having a very large scale integrated circuit, in accordance with an embodiment of the invention.

FIG. 1 is a plan view illustrating a layout 10 for a design of a portion of a microelectronic element 12. As used herein, the term "layout" refers to a design representation of at least a portion of an integrated circuit, the layout specifying at least dimensions, placement and orientation of features of semiconductor devices included in the design. The microelectronic element can be a very large scale integrated circuit such as provided on a semiconductor chip, for example. As illustrated therein, the layout includes a plurality of microelectronic devices, e.g., semiconductor devices, including n-type field effect transistors ("NFETs") 14a, 14b and p-type field effect transistors ("PFETs") 16a, 16b. The layout can include additional microelectronic devices (not shown) and additional types of microelectronic devices (not shown), e.g., active devices such as transistors, diodes, among others, as well as passive devices such as capacitors, inductors and resistors. Referring to FIG. 1, each of the NFETs 14a, 14b has a corresponding active semiconductor region 18a, 18b and each of the PFETs 16a, 16b has a corresponding active semiconductor region 20a, 20b. Each of the active semiconductor regions 16a, 16b, 20a, 20b is separated from every other such active semiconductor region by one or more shallow trench isolation ("STI") regions 22. Each of the NFETs 14a, 14b also has a corresponding gate conductor 24a, 24b and each of the PFETs 16a, 16b has a corresponding gate conductor 26a, 26b.

As further illustrated in FIG. 1, each of the NFETs 14a, 14b has a corresponding stressed dielectric liner 28a, 28b overlying the respective active semiconductor region 18a, 18b and the gate conductors 24a, 24b. Likewise, each of the PFETs 16a, 16b has a corresponding stressed dielectric liner 30a, 30b overlying the respective active semiconductor region 20a, 20b and the gate conductors 26a, 26b. Each stressed liner applies a stress to a conduction channel of the corresponding transistor, such that, in one example, increased mobility and current can be obtained when the transistor is turned on. Typically, a compressive stressed liner is disposed above the active semiconductor region of a PFET in order to increase the current through the PFET when it is turned on. A tensile stressed liner typically is disposed above the active semiconductor region of an NFET in order to increase the current through such NFET when it is turned on. Alternatively, a tensile stressed liner can be disposed above the active semiconductor region of a PFET, which will then tend to decrease the amount of current through such PFET when it is turned on. Likewise, when a compressive stressed liner is disposed above the active semiconductor region of an NFET, the amount of on-current of such NFET typically decreases.

In general, the performance of transistor can be tuned by varying one or more of the edge positions of the stressed liner overlying such transistor. Therefore, in accordance with the method described herein, the edge positions of the stressed liners in the layout can vary from one transistor to another. For example, as seen in FIG. 1, the edge positions of some stressed liners are different from the edge positions of others. For example, on the right-hand side of FIG. 1, the edge 28b' of the stressed liner 28b belonging to the NFET 14b occurs at a position which is spaced apart from the nearest edge 30b' of the stressed liner 30b belonging to the PFET 16b. Stated another way, the edges 28b', 30b' of the adjacent stressed liners do not overlap. On the other hand, on the left-hand side of FIG. 1, the edge 28a' of the stressed liner 28a belonging to the NFET 14a occurs at a position which does overlap the edge 30a' of the adjacent stressed liner 30a that belongs to the PFET 16a. As best seen in the corresponding sectional view thereof in FIG. 2, an edge 30a' of the stressed liner 30a belonging to the PFET 16a extends laterally beyond the edge 28a' of stressed liner 28a belonging to the NFET 14a, such that the liner 30a of the PFET overlaps the liner 28a of the NFET.

Figure 2:
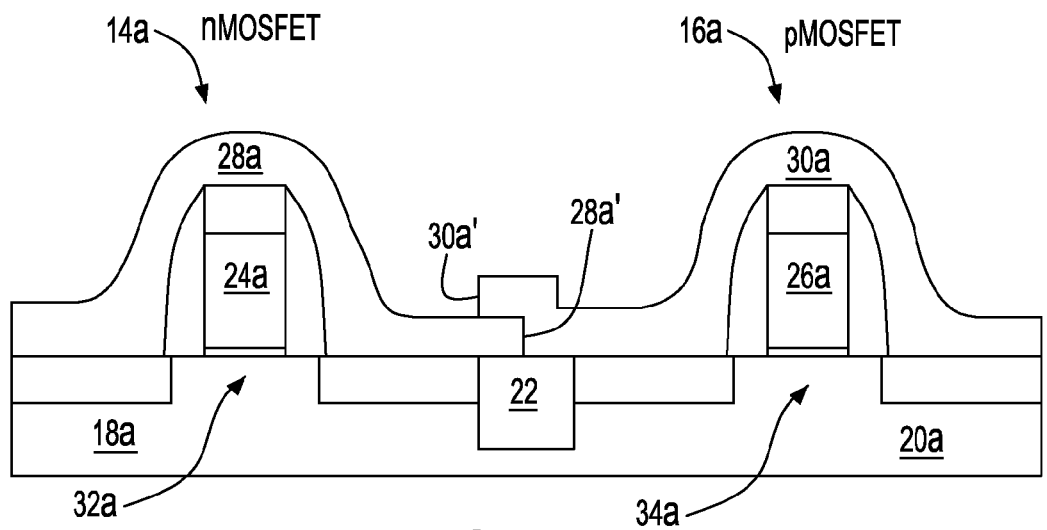
FIG. 2 is a sectional view through line 2-2 of FIG. 1 illustrating an exemplary n-type field effect transistor ("NFET") and exemplary p-type field effect transistor ("PFET"), in accordance with an embodiment of the invention.

FIG. 2 further illustrates features of the transistors including active semiconductor regions 18a, 20a separated from each other by STI region 22. The conduction channels 32a and 34a of the NFET 14a and the PFET 16a are further illustrated in FIG. 2, each of the conduction channels 32a, 34a being disposed below the corresponding one of the gate conductors 24a, 26a.

Figure 3:
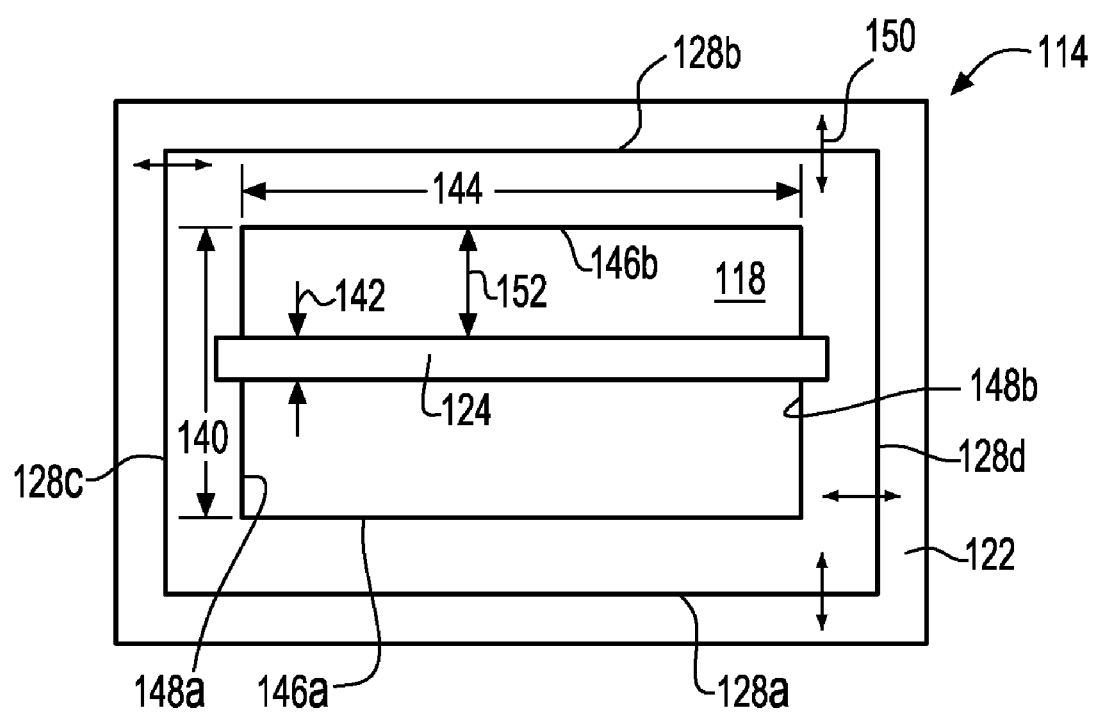
FIG. 3 is a plan view further illustrating an exemplary NFET of the layout illustrated in FIG. 1, in accordance with an embodiment of the invention.

FIG. 3 is a plan view illustrating the structure of an individual field effect transistor of the circuit design, e.g., an NFET 114, which can be the same or different from the structure of the NFET 14a shown and described above with reference to FIGS. 1 and 2. As shown therein, the NFET 114 has an active semiconductor region 118 which is defined by longitudinal edges 146a, 146b and transverse edges 148a, 148b of an adjoining isolation region, such as a shallow trench isolation ("STI") region, for example. The active semiconductor region 118 has a longitudinal dimension 140 aligned with a direction of a length 142 of the conduction channel of the transistor. The active semiconductor region 118 also has a transverse dimension 144 which is equal to the width of the conduction channel of the NFET.

As will be understood from the following description, for each transistor in the layout, the design of such a device is changed when such change helps achieve an overall collective performance goal for the devices of the layout. As further illustrated in FIG. 3, the edges of the stressed liner 128 of a transistor 114 occur at longitudinal edge positions 128a and 128b and transverse edge positions 128c and 128d. The design of such transistor 114 can be changed potentially in several ways by changing one or more of the edge positions of the stressed liner belonging to such transistor when doing so helps the devices in the circuit design to collectively achieve the overall performance goal. Also contemplated is the possibility that altering the layout of a given device, e.g., transistor, affects other devices. The methods described below in accordance with the embodiments of the invention account for that possibility, since each can be applied to achieving a performance goal for the circuit considered globally. In this case, in an embodiment of the invention herein, the process of achieving an overall performance goal for the devices in the circuit represented by the design is not the same as merely maximizing the performance of each individual device of the circuit. Rather, in accordance with such embodiment, the effect of increasing the performance of each individual device is considered in relation to the performance of one or more other devices to which the individual device is connected, directly or indirectly. For example, many devices may be connected together in combinational logic circuits, i.e., circuits such as logic gates whose outputs can switch between high and low values as soon as the value of one input changes. In such combinational logic circuits, one logic gate such as, for example, an AND gate receives the outputs of two or more other logic gates. The same is true for other types of logic gates such as an OR gate, a NAND gate or a NOR gate, among others.

Thus, the speed of a particular device should not be increased so much by the change in the design of that device that the speed would then exceed the speed at which another device receiving the output of the particular device is ready to receive the input. Likewise, the speed of the particular device should not be increased so much by the change in the device design that the speed would then exceed the speed at which another device connected to the output of the particular device can receive such output. The degree to which the speeds of connected transistors are compatible can be referred to as "matching". In one case, for a combinational logic circuit there may be a target to achieve matching of less than a 5% difference in speeds between two directly connected transistors. In another case, the target may allow for a 20% difference in the speeds between the directly connected transistors. Sequential logic circuits, that is, circuits such as flip-flops whose outputs switch between high and low values at edges of a clock signal, are constructed from combinational logic circuits. For this reason, many of the same concerns apply to sequential logic circuits as well as combinational logic circuits.

Thus, the contribution of one transistor 114 to an overall performance goal to be achieved by a plurality of semiconductor devices connected in a circuit is based on two different considerations: individual performance and matching between the performance of a particular transistor and the other devices to which it is connected.

In an embodiment of the invention, an edge position of a stressed liner belonging to a particular transistor represented in the design can be moved to a new edge position when a resulting change in the performance of that transistor and the degree of matching between that transistor and others would improve performance of a circuit within which that transistor is connected. Typically, the edge position is moved in a particular direction relative to a fixed reference. Conversely, when the change in the performance of the particular transistor and the degree of matching between that transistor and others would not improve the performance, such edge position will not be moved.

In accordance with an embodiment of the invention, a method of improving a circuit design for at least a portion of a microelectronic element will now be described with reference to the flowchart in FIG. 4. In a preliminary step of the method, an initial layout 210 is generated by design automation tools. Included in the layout is a representation of the design of all the microelectronic devices for such portion of the microelectronic element and their interconnections. Thus, the layout indicates the edge positions 146a, 146b, 148a and 148b of the active semiconductor region 118 (FIG. 3), as bounded by an STI region 122, as well as indicating the length 142 and width 144 of the conduction channel. The layout also indicates the edge positions 128a, 128b, 128c and 128d of the stressed liner.

As illustrated in block 220, an analysis is conducted to determine whether the layout meets a set of performance and matching targets 225. The analysis method can consist of any of several methods known as "analog quality", which are considered full simulation using a program such as SPICE ("Simulation Program with Integrated Circuit Emphasis") or one of several reduced accuracy methods. The performance and matching targets of individual devices address an overall performance goal for the transistors of the layout considered collectively. In addition, in this block individual goals for performance and matching of individual devices with other individual devices can be identified as well as a determination of whether the individual devices meet such goals. Coordinate locations of devices which do not meet individual goals can be identified in this block as well.

In block 230, it is determined whether all goals for performance and matching are met. Typically, the goals have not been achieved yet at this stage, and the outcome then is "No" such that steps are now performed to improve the design of individual transistors when it serves the overall performance goal. The designs of particular devices of the layout which do not meet individual goals for performance and matching are now considered one by one to determine whether the performance, matching or both can be improved.

In block 235 the next device in the layout is selected for consideration. If there was no previous device, this device will be the first device to be considered. Then, in block 240 a determination is made whether movement in an edge position of the stressed liner for the individual device would serve the overall performance goal for the layout. Any of the positions of the edges 128a, 128b, 128c and 128d of (FIG. 3) of the stressed liner can be moved in a direction to improve the performance of the device, its matching relative to other devices in the layout or both. Sometimes, moving the position of one edge of the stressed liner improves matching without improving the performance or even causing the performance of the individual device to decrease. The effect of moving the edge position of the stressed liner on both performance and matching is considered in block 240. When the determination is "Yes", then in block 245 the edge position is moved by an amount, i.e., a distance which best serves the performance and matching goals for the circuit in which the individual device is connected. The amount, i.e., the distance, by which the edge position is moved can vary within a range of values. In one example, in a 65 nm technology, the position of an edge 128b can vary within a range of distances of between 50 nm and 180 nm from an adjacent edge 146b of the STI region. In a usual case, in block 245 the edge position of the stressed liner of the individual device is moved by such distance which is calculated to best serve the combination of performance and matching goals for the circuit in which the individual device is connected.

Movement in the positions of two, three or all edges 128a, 128b, 128c and 128d of the stressed liner of the individual device can be considered at once in block 240 such that in block 245 the positions of multiple edges of the stressed liner can be moved at once to serve a performance or matching goal for that device.

Occasionally, in block 240 it may be determined for a particular device that movement in the edge position of the stressed liner does not serve the performance or matching goal. In that case, the determination in block 240 is "No". Subsequently, in block 250 it is determined whether that particular device should be removed from the list of devices for which performance is sought to be improved. Stated another way, the device may be removed from further attempts to increase performance through a change in the edge position of the stressed liner. This determination can be made when it is not possible to increase the performance of that particular device within the layout or a change in the edge positions of the stressed liner lead to degradation of performance of other devices in the circuit design. When the determination is "Yes", the particular device should be removed because a change in the edge position of the stressed liner may produce no performance increase. On the other hand, the determination can also be "Yes" when the particular device should be removed when that device does not contribute to either the performance or matching goals of the devices considered collectively within the layout. In either case, in step 255 that particular device is removed from the list of devices for which performance is sought to be increased through moving an edge position of the stressed liner.

Subsequently to the steps performed with respect to block 245 or block 250, a determination is made whether the last device has been considered yet. In a typical case when the determination is "No" that this is not the last device, in block 235 the next device then is considered and the steps described above with respect to block 240 et seq. are applied to such device. When the determination is "Yes" that this is the last device, in step 220 an analysis then is made whether performance and matching goals for the layout are met. This analysis can be the same or similar to the analysis performed initially with reference to block 220. Then, in block 230 when it is determined that the goal (e.g., performance, matching or both) are met, in block 270 a final check is made whether tolerances and design rules are properly met by all the devices under consideration. For example, a design rule may require the edge position of the stressed liner to be no closer than a minimum distance from the edge of the active semiconductor region. Alternatively, this step can be applied to all devices of the layout, even if features, e.g., the stressed liner, of some of the devices have not changed. In this way, the effects of the changes to the designs of particular devices in block 245 can be considered in relation to other devices whose designs have not changed. Any violations of the tolerances or design rules which are found at this time can also be addressed at this stage by automatically correcting the features of the device design to meet such tolerances or design rules.

In a variation of the above-described method, in block 240, rather than considering each device individually, a plurality of devices are considered simultaneously to determine whether the edge positions of the stressed liners belonging thereto should be moved. For example, all of the devices in a particular path or block of the microelectronic element, e.g., semiconductor chip, can be considered simultaneously. In another example, all of the devices belonging to one macro-level subdivision for the microelectronic element can be considered simultaneously. In another example, all of the devices of the entire microelectronic element can be considered and treated simultaneously.

Figure 4:
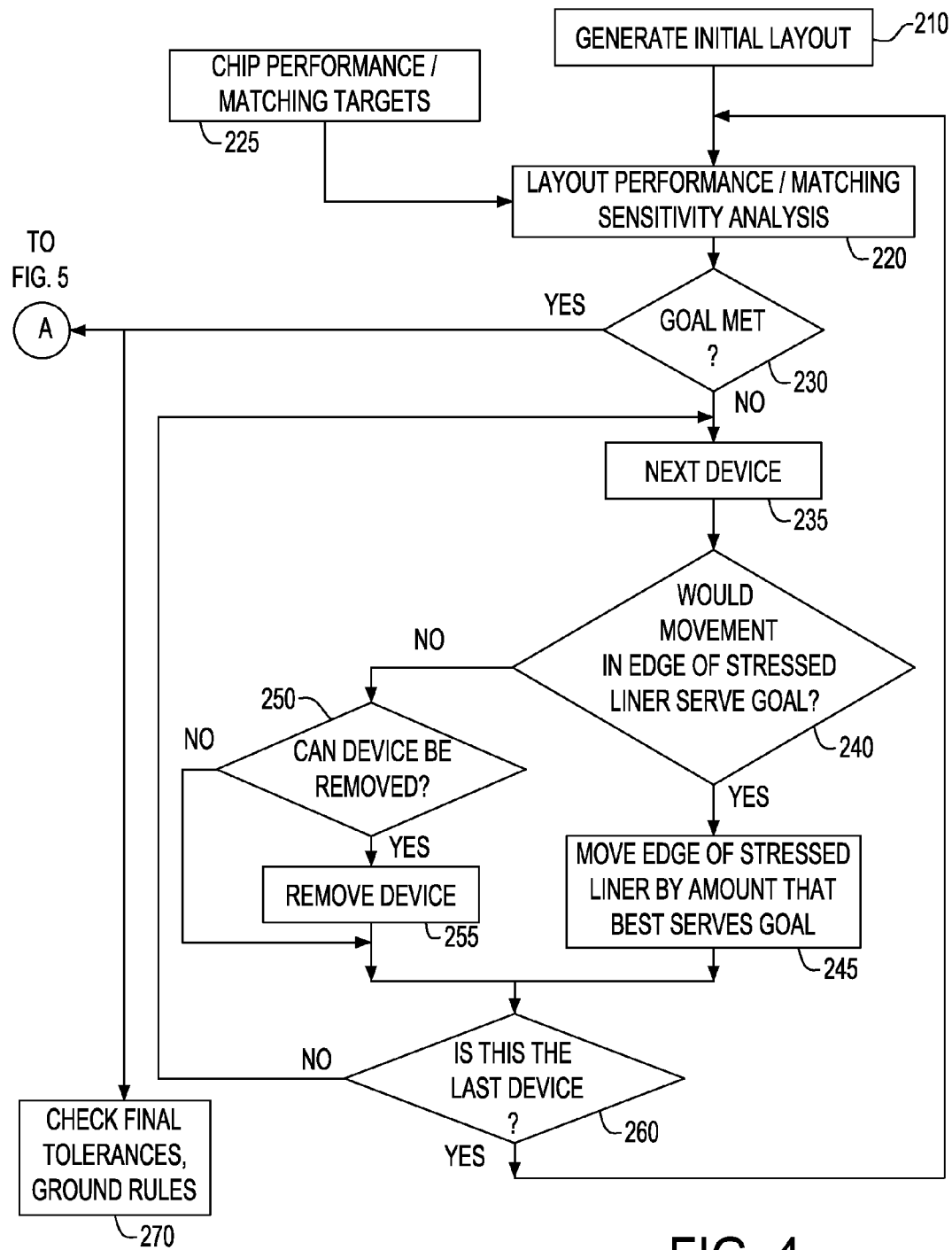
FIG. 4 is a flowchart illustrating a method of improving a circuit design for at least a portion of a microelectronic element, in accordance with an embodiment of the invention.
Figure 5:
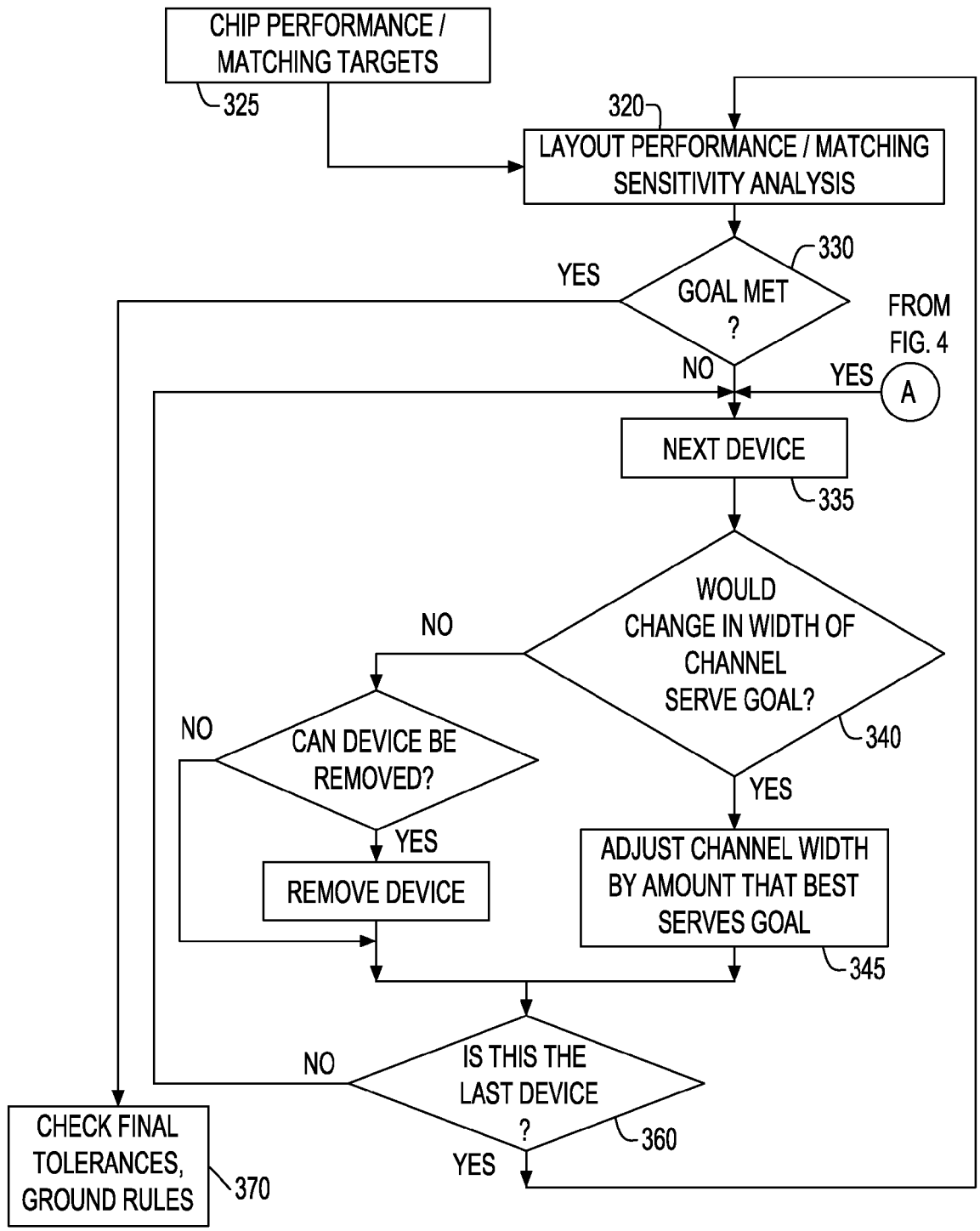
FIG. 5 is a flowchart further illustrating a method of improving a circuit design for at least a portion of a microelectronic element, in accordance with an embodiment of the invention.

FIG. 5 illustrates another variation of the method described with reference to FIG. 4. The variation of the method illustrated in FIG. 5 is performed when all devices for which concerns are initially identified in block 220 (FIG. 4) have been considered in block 240 and the analysis of the second pass through block 220 has been performed. When the performance and matching goals for those devices is still not met in block 230, additional steps can be performed as illustrated in FIG. 5 in which a width of a channel of each device can be adjusted to serve the goal.

In this case, instead of then continuing with block 235 of FIG. 4, the method continues with consideration of the next device (block 335) where in block 340 it is determined whether a change in the width 144 (FIG. 3) of the conduction channel of the transistor would serve the goal, e.g., the performance and matching goals for that device. Similar to that described above with respect to block 245 (FIG. 4), when the outcome of block 340 is "Yes", in block 345 the channel width of the device may then be adjusted, i.e., widened or narrowed by an amount that best serves the goal.

In block 360 it is determined whether this is the last device to be considered this way, and if the outcome is "Yes", an analysis is performed (block 320) to relative to performance and matching goals (block 325). If it is then determined (block 330) that a goal, e.g., performance and matching goals, have been met for the devices under consideration, a final check is performed relative to tolerances and design rules in block 370, similar to that described above with reference to block 270 (FIG. 4).

In another variation of the above-described embodiment (FIG. 4), a method is provided in which the performance of the circuit design is improved by iterating between the operations shown in FIGS. 4 and 5. Alternatively, the two flows can be merged into one. In such case, the operations shown in blocks 340, 345 are performed relative to the device under consideration immediately following the operations shown in blocks 240, 245.

In yet another variation of the above-described embodiment (FIG. 4), change in a different feature of the layout is considered for affecting the performance of the device. For example, the layout feature to be changed can be the distance 152 (FIG. 3) between the edge of the gate conductor 124 and the adjacent edge 146b of the active semiconductor region 118 in the direction of current flow within the device 114. In such case, block 240 of FIG. 4 is altered such that a movement in that edge of the active semiconductor region relative to the edge of the gate conductor is considered. In addition, in block 245, that edge of the active semiconductor region is moved by the amount that best serves the goal.

Figure 6:
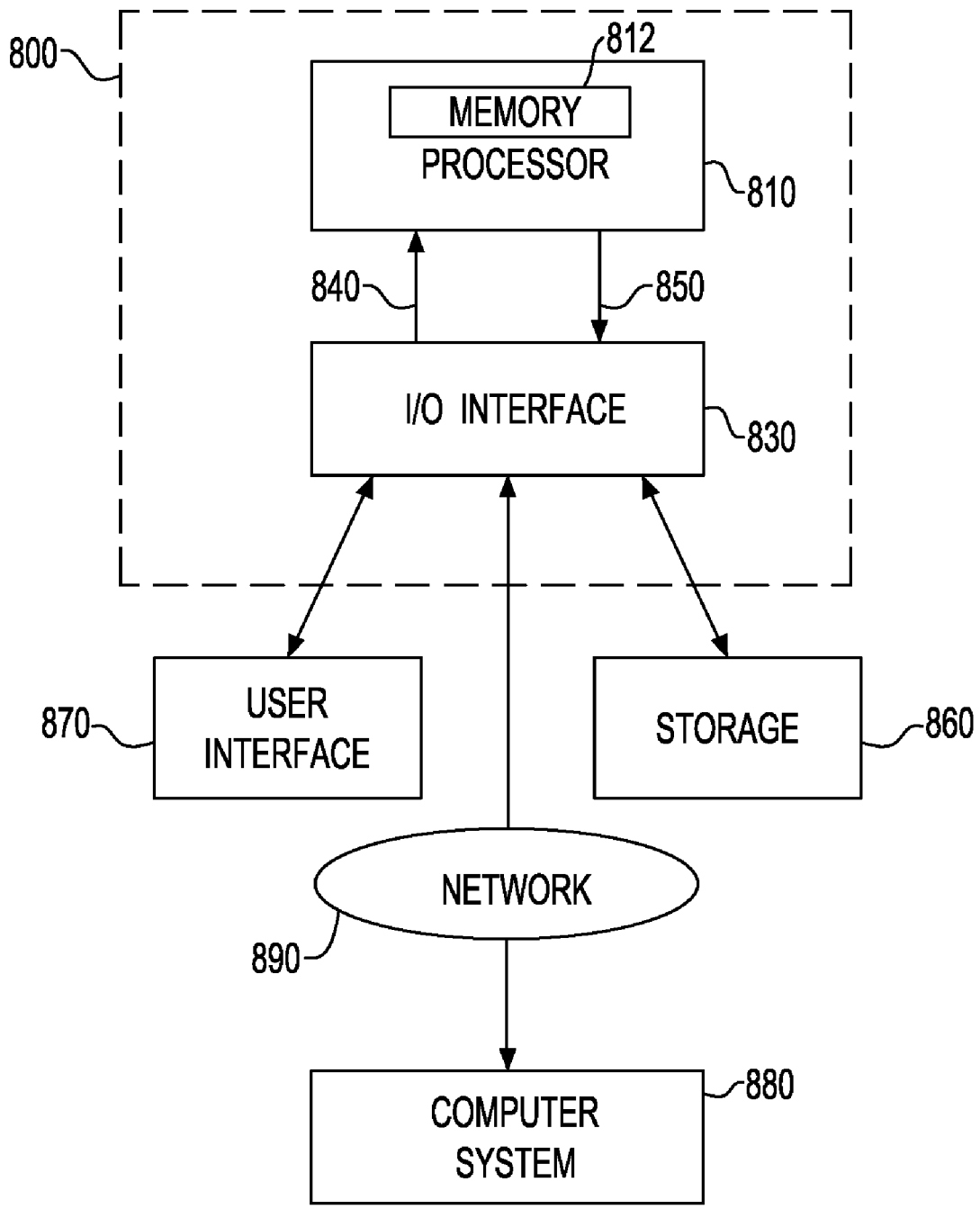
FIG. 6 is a block diagram illustrating an information processing apparatus in accordance with an embodiment of the invention.

It is expected that the above-described methods will be performed by an information processing system such as a computer, e.g., a system having a processor capable of executing a series of instructions provided to the information processing system in a computer-readable form. FIG. 6 illustrates an information processing system 800 in accordance with an embodiment of the invention. As shown in FIG. 6, the information processing system includes a first processor 810 provided with a memory 812. The processor 810 may be a single processor or may include a plurality of processors arranged to execute instructions of a program in a parallel or semi-parallel manner. An input output (I/O) and network interface 830 (hereinafter "I/O interface") is provided for inputting a program including instructions and data for performing a method, such as that described above with reference to FIGS. 4 and 5, to the processor 810 and for outputting the results of executing a program. The I/O interface 830 preferably includes one or more types of interfaces to removable digital storage media such as a magnetic disk, magneto-optic disk, read/write disc, read only optical disc, digital tape, removable disk drive, removable solid state memory such as a portable memory card, among others. In addition, the I/O interface includes a network interface such as a modem or network adapter card for permitting transfer of information to and from a network. The I/O interface 830 may also include a display or other user interface 870 for outputting information to a user, inputting information from the user or both. The user interface 870 may additionally include one or more other interface devices such as a keyboard, mouse, speaker, joystick, scanner, printer, etc. and the like. To the extent that any of the above described types of removable storage media are inserted or connected to the I/O interface, a program containing a set of instructions that is stored in such removable storage medium can be transferred as input 840 between the I/O interface 830 and the processor 810. In addition to the program, data, e.g., one or more of circuit design data, other data, etc., to be operated upon by the instructions is also input over the I/O interface 830, e.g. from storage 860 or from one or more computer systems, e.g., through a server computer 880 through a network 890. Once the program and the data set to be operated upon have been loaded into the processor 810, the processor then executes the set of instructions of the program relative to the data and provides output 850 to the I/O interface 830 connected thereto.

In one embodiment, a program containing information, e.g., instructions for performing a method according to an embodiment of the invention is stored on one or more removable storage media to be provided to the I/O interface 830 and loaded into the processor 810. Alternatively, the program containing the instructions is transferred from storage 860, a removable storage medium or a memory of one or more other computers, e.g., computer system 880 or other storage devices of a network to a modem, network adapter or other device of the I/O interface 830 and further transferred therefrom to the processor 810. After the processor 810 receives and loads the program into memory, the program is then executed relative to the set of data provided to the processor 810. In such way, a method of automatically improving a circuit design in accordance with one or more of the above-described methods can be performed in accordance with an embodiment of the invention.

While the invention has been described in accordance with certain preferred embodiments thereof, many modifications and enhancements can be made thereto without departing from the true scope and spirit of the invention, which is limited only by the claims appended below.

What is claimed is:

1. A method of improving a design for a very large scale integrated circuit, the design representing a plurality of semiconductor devices interconnected in a circuit, the method comprising:

using a computer to perform:

a) determining whether an edge of a feature of one of the plurality of semiconductor devices in the design can be moved in a first direction by a distance within a permitted range such that a performance goal and a matching goal for the circuit are served, and if so, b) moving the edge of the feature in the first direction by the distance, the distance being calculated to best serve the performance goal and the matching goal;

c) repeating steps (a) and (b) for each of the plurality of semiconductor devices; and d) repeating steps (a), (b) and (c), if necessary, until the performance goal and matching goal for the circuit are deemed to be adequately served, wherein each of the semiconductor devices includes a transistor having a channel whose length extends in a longitudinal direction and whose width extends in a transverse direction, and the feature includes a stressed liner, the edge including a first edge of the stressed liner extending in the transverse direction and a second edge of the stressed liner extending in the longitudinal direction, wherein step (b) includes moving the first edge in the longitudinal direction and moving the second edge in the transverse direction.

2. The method as claimed in claim 1, wherein the edge further includes a third edge of the stressed liner remote from the first edge and step (b) includes moving the third edge in the longitudinal direction.

3. The method as claimed in claim 2, wherein the edge further includes a fourth edge of the stressed liner remote from the second edge and step (b) includes moving the third edge in the transverse direction.

4. The method as claimed in claim 1, wherein the moving of the feature in the transverse direction includes
  e) determining whether at least one of first and second edges of an active semiconductor region which define a width of the channel can be moved in the transverse direction by a distance within a permitted range such that a performance goal and a matching goal for the circuit are served, and if so,
  f) moving the at least one edge in the transverse direction by the distance, the distance being calculated to best serve the performance goal and the matching goal;
  g) repeating steps (e) and (f) for each of the plurality of semiconductor devices; and
  h) repeating steps (e), (f) and (g), if necessary, until the performance goal and matching goal for the circuit are deemed to be adequately served.

5. The method as claimed in claim 1, wherein step (b) includes moving the edge of the feature the calculated distance, even when doing so decreases an individual performance of the one semiconductor device.

6. The method as claimed in claim 5, wherein the permitted range is limited by a design rule.

7. The method as claimed in claim 6, wherein the design rule requires a minimum distance between the edge and an edge of an active semiconductor region in which the semiconductor device is disposed.

8. A method of improving a design for a very large scale integrated circuit, the design representing a plurality of semiconductor devices interconnected in a circuit, the method comprising:
  using a computer to perform:
  a) determining whether an edge of a feature of one of the plurality of semiconductor devices in the design can be moved in a first direction by a distance within a permitted range such that a performance goal and a matching goal for the circuit are served, and if so,
  b) moving the edge of the feature in the first direction by the distance, the distance being calculated to best serve the performance goal and the matching goal;
  c) repeating steps (a) and (b) for each of the plurality of semiconductor devices; and
  d) repeating steps (a), (b) and (c), if necessary, until the performance goal and matching goal for the circuit are deemed to be adequately served, wherein each of the plurality of semiconductor devices includes a transistor disposed in an active semiconductor region, the transistor having a channel whose length extends in a longitudinal direction, such transistor being separated in the longitudinal direction from at least one other transistor by an isolation region, and step (b) includes moving an edge of the active semiconductor region in the longitudinal direction, wherein the transistor has a gate conductor and the edge is separated from the gate conductor in the longitudinal direction.

9. The method as claimed in claim 8, the method further comprising, after step (d), using a computer to perform:
  e) determining whether at least one edge of the active semiconductor region can be moved in the longitudinal direction by a distance within a permitted range such that a performance goal and a matching goal for the circuit are served, and if so,
  f) moving the at least one edge in the longitudinal direction by the distance, the distance being calculated to best serve the performance goal and the matching goal;
  g) repeating steps (e) and (f) for each of the plurality of semiconductor devices; and
  h) repeating steps (e), (f) and (g), if necessary, until the performance goal and matching goal for the circuit are deemed to be adequately served.

10. A recording medium having computer-readable instructions recorded thereon, the instructions being executable by a computer to perform a method of improving a design for a very large scale integrated circuit, the design representing a plurality of semiconductor devices interconnected in a circuit, the method comprising the steps of:
  a) determining whether an edge of a feature of one of the plurality of semiconductor devices in the design can be moved in a first direction by a distance within a permitted range such that a performance goal and a matching goal for the circuit are served, and if so,
  b) moving the edge of the feature in the first direction by the distance, the distance being calculated to best serve the performance goal and the matching goal;
  c) repeating steps (a) and (b) for each of the plurality of semiconductor devices; and
  d) repeating steps (a), (b) and (c), if necessary, until the performance goal and matching goal for the circuit are deemed to be adequately served, wherein each of the semiconductor devices includes a transistor having a channel whose length extends in a longitudinal direction and whose width extends in a transverse direction, and the feature includes a stressed liner, the edge including a first edge of the stressed liner extending in the transverse direction and a second edge of the stressed liner extending in the longitudinal direction, wherein step (b) includes moving the first edge in the longitudinal direction and moving the second edge in the transverse direction.

* * * * *